United States Patent
Agarwal et al.

(10) Patent No.: US 7,474,574 B1
(45) Date of Patent: Jan. 6, 2009

(54) SHIFT REGISTER LATCH WITH EMBEDDED DYNAMIC RANDOM ACCESS MEMORY SCAN ONLY CELL

(75) Inventors: Vikas Agarwal, Austin, TX (US); Sam Gat-Shang Chu, Round Rock, TX (US); Saiful Islam, Austin, TX (US); Philip George Shephard, III, Round Rock, TX (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 11/772,592

(22) Filed: Jul. 2, 2007

(51) Int. Cl.
*G11C 7/00* (2006.01)
(52) U.S. Cl. .................... 365/201; 365/189.05
(58) Field of Classification Search ................. 365/201
See application file for complete search history.

(56) References Cited

U.S. PATENT DOCUMENTS

| | | | |
|---|---|---|---|
| 5,428,574 A * | 6/1995 | Kuo et al. | 365/201 |
| 5,610,926 A * | 3/1997 | Marris | 714/726 |
| 7,032,142 B2 * | 4/2006 | Fujioka et al. | 365/201 |
| 2004/0250165 A1 * | 12/2004 | Tanizaki | 714/30 |

* cited by examiner

*Primary Examiner*—Son L Mai
(74) *Attorney, Agent, or Firm*—Duke W. Yee; Diana R. Gerhardt; Cathrine K. Kinslow

(57) ABSTRACT

A hybrid shift register latch which uses static memory cells for system operations and a dynamic memory cell for testing operations only. An L1 storage element and an L2 storage element are provided in an array cell. The L1 storage element comprises a static random access memory cell. The L1 storage element is used during system and testing operation of the array cell. The L2 storage element comprises a dynamic random access memory cell. The L2 storage element is used only during testing operation of the array cell.

7 Claims, 3 Drawing Sheets

SHIFT REGISTER LATCH WITH EMBEDDED DYNAMIC RANDOM ACCESS MEMORY SCAN ONLY CELL

BACKGROUND

1. Field of the Invention

The present application relates generally to semiconductor circuits, and in particular to a hybrid shift register latch which uses static memory cells for system operations and a dynamic memory cell for testing operations only.

2. Description of the Related Art

Shift register latches (SRLS) are commonly used for testing and debugging of digital semiconductor chips. A shift register latch may be directly arranged on a logic semiconductor chip or on a storage chip. The semiconductor chip may comprise logic paths which provide their inputs and outputs to certain memory elements in the circuit. These memory elements are configurable to become shift register latches.

Shift register latches serve a dual purpose, one during test and one during normal system operation. When testing the circuit, shift register latches store predetermined data patterns through a shifting operation. Multiple shift register latches may create a scan path with the output signals from each latch supplied to a register for comparison and analysis with known results. When operating the circuit in the normal system environment, the shift register latches function as memory elements passing signals for processing from one block to another, and at the same time typically receiving input signals for subsequent application to logic blocks in subsequent clock cycles.

SUMMARY

The illustrative embodiments provide a hybrid shift register latch which uses static memory cells for system operations and a dynamic memory cell for testing operations only. A level one (L1) storage element and a level two (L2) storage element are provided in an array cell. The L1 storage element comprises a static random access memory cell. The L1 storage element is used during system and testing operation of the array cell. The L2 storage element comprises a dynamic random access memory cell. The L2 storage element is used only during testing operation of the array cell.

BRIEF DESCRIPTION OF THE DRAWINGS

The novel features believed characteristic of the illustrative embodiments are set forth in the appended claims. The illustrative embodiments themselves, however, as well as a preferred mode of use, further objectives and advantages thereof, will best be understood by reference to the following detailed description of the illustrative embodiments when read in conjunction with the accompanying drawings, wherein:

DETAILED DESCRIPTION OF THE PREFERRED EMBODIMENT

Shift register latches are desirable for testing and debugging of digital semiconductor chips. However, as previously mentioned, in some applications during testing mode, one of the latches in a shift register latch circuit is used only in the scan path (for testing operations), and is not used in the system path (normal system operations). Each of these latches in the circuit takes up space on the chip and consumes power. On smaller scannable register arrays, it is desirable to use scannable Static Random Access Memory (SRAM) memory cells instead of non-scannable SRAM memory cells to enable easier testing and debugging. SRAM is a type of memory cell which stores data in a "flip flop". A "flip flop" may include two cross-connected NAND or NOR gates. An SRAM maintains its data without external refresh circuitry. An advantage of using SRAM is that these memory cells function at high speeds. However, using scannable SRAM cells may double the number of memory bits that is required on the chip, although the scan-only latch portion of the shift register latch may be smaller than the main memory cell. Thus, reducing the space and power consumption of the scan-only latches in a scannable register arrays is highly desirable.

The illustrative embodiments solve the problems in the current art by providing a dynamic memory cell for one of the latches in a shift register latch. The dynamic memory cell, or Dynamic Random Access Memory (DRAM) cell, may be used in situations where the latch to be made dynamic is only used for scan operations. DRAM is a type of memory cell which stores data in essentially a capacitor coupled to a transistor. The transistor transfers charge to and from the capacitor. The absence or presence of charge on the capacitor corresponds to a logic value of data stored in the DRAM memory cell. In contrast with an SRAM cell which maintains its data for as long as power is supplied to the circuit, the data in a DRAM cell must be constantly refreshed (read out and then rewritten back in) since the charge on the capacitor gradually leaks out over time. During testing (scan) operations, the dynamic latch is used for testing and debugging of the digital chip. During normal system operations, it does not matter if the dynamic latch loses its data, as long as the dynamic latch is clocked at the beginning of a testing operation to refresh the latch. Use of the DRAM cell in a scan-only operation allows for reducing the space and power consumption of the circuit in comparison to using a conventional SRAM cell, without any loss in functionality. Use of the DRAM cell in the illustrative embodiments also enable large register arrays to be scannable, thereby eliminating the overhead and complexity of the logic that would otherwise be required for testing and debug of the large array.

Figure 1:
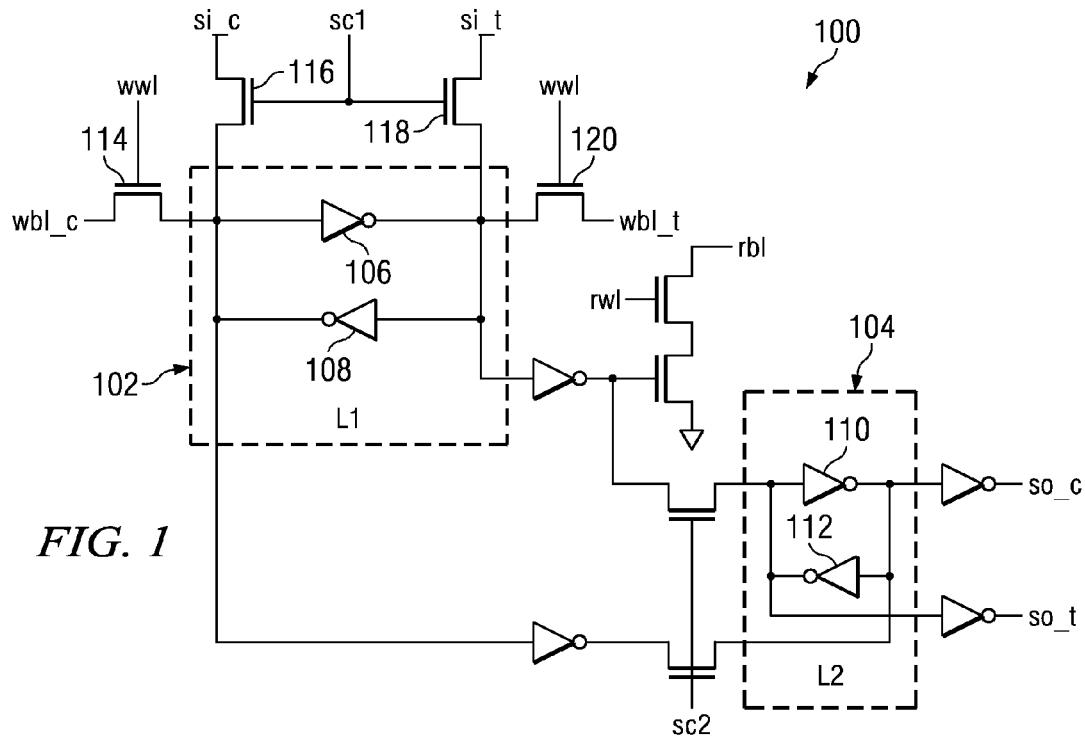
FIG. 1 is a circuit diagram of a known scannable array cell.

Turning now to FIG. 1, a circuit diagram of a known scannable array cell is shown. In particular, FIG. 1 illustrates a typical scannable array cell 100 typically used in small and medium sized arrays. Array cell 100 comprises an L1 storage element 102 and an L2 storage element 104. Each of L1 storage element 102 and L2 storage element 104 is an SRAM cell comprising back-to-back inverters, such as inverter 106 and 108 in L1 storage element 102, and inverters 110 and 112 in L2 storage element 104. Each SRAM cell also may typically comprise between four and six transistors, such as transistors 114-120 for L1 storage element 102.

L1 storage element 102 is the only portion of array cell 100 which is used during normal system operation. In contrast, L2 storage element 104 is the only portion of array cell 100 which is used during testing operation. L2 storage element 104 loads/unloads data from the array cell 100 using a 2-phase clock (not shown). Since L2 storage element 104 is only used for testing the circuit, the L2 storage element 104 portion of array cell 100 does not need to store data values for long time periods. However, using a full SRAM cell for L2 storage element 104 has a substantial impact on space consumption of the circuit, since a typical SRAM bit comprises between four and six transistors. In addition, using a full SRAM cell for L2 storage element 104 consumes considerable DC power for an element that is not used during normal system operation.

Figure 2:
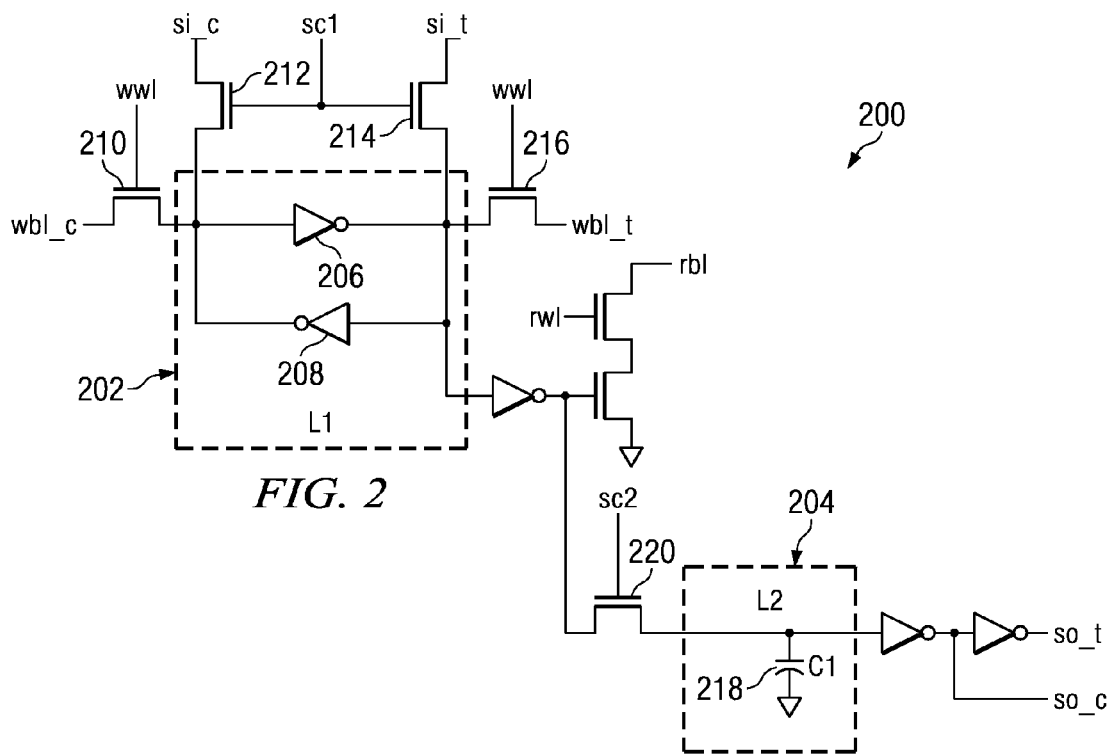
FIG. 2 is a circuit diagram of a hybrid shift register latch in accordance with the illustrative embodiments.

FIG. 2 is a circuit diagram of a hybrid shift register latch in accordance with the illustrative embodiments. Array cell 200 comprises an L1 storage element 202 and an L2 storage element 204. L1 storage element 202 is the only portion of array cell 200 which is used during both normal system operation and scan-based testing. L2 storage element 204 is the only portion of array cell 200 which is used during scan-based testing. In contrast with the shift register latch in FIG. 1, the hybrid shift register latch in FIG. 2 uses an SRAM cell for the system operation portion of the latch, such as L1 storage element 202, and a DRAM cell for the test-only portion of the latch, such as L2 storage element 204. While a typical SRAM bit comprises back-to-back inverters and between four and six transistors, such as inverters 206 and 208 and transistors 210-216, a DRAM bit comprises a capacitor and only one transistor, such as capacitor 218 and transistor 220.

An advantage of using a DRAM cell for L2 storage element 204 allows that portion of the latch to take up a smaller area of space than the amount of space that would be consumed by a traditional SRAM cell latch, such as L2 storage element 104 in FIG. 1. In one particular example, use of a DRAM cell for the test-only portion of the latch may result in almost a 50% reduction in the space consumed by the L2 portion of the latch (i.e., L2 storage element 104). The smaller area consumed by the test-only portion of the latch will also allow for the creation of denser and faster arrays.

Another benefit of using a DRAM cell for L2 storage element 204 is that the DRAM cell has less leakage of power compared to a traditional SRAM cell latch, without any loss in functionality. The DRAM cell reduces power leakage in L2 storage element 204 since there are no back-to-back inverters that are always on in L2 storage element 204, as compared to traditional L2 storage element 104 in FIG. 1. In addition, the power leakage in L2 storage element 204 reduces over time as the charge on the capacitor decreases to 0.

Figure 3:
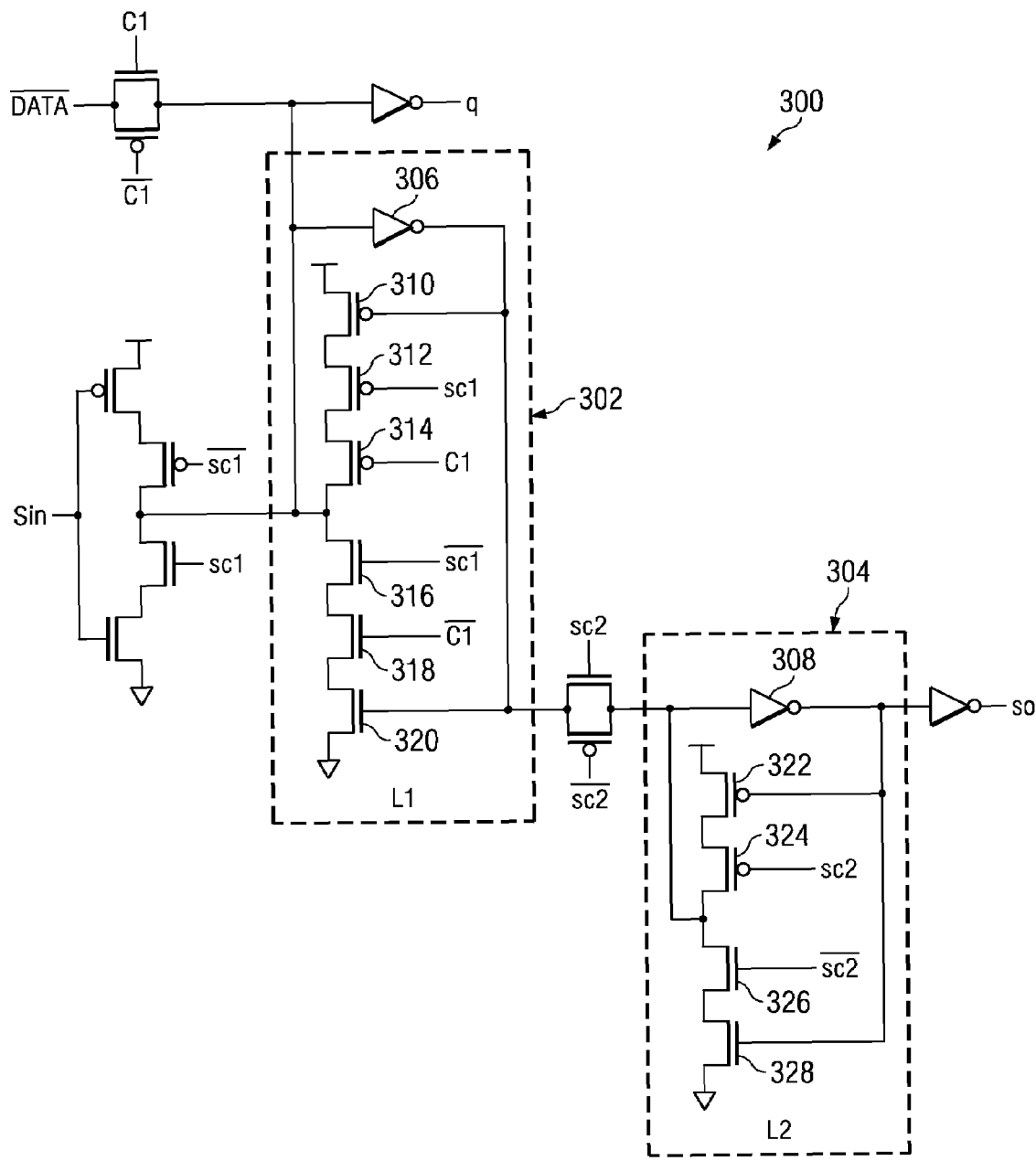
FIG. 3 is a circuit diagram of an alternative hybrid shift register latch in accordance with the illustrative embodiments.
Figure 4:
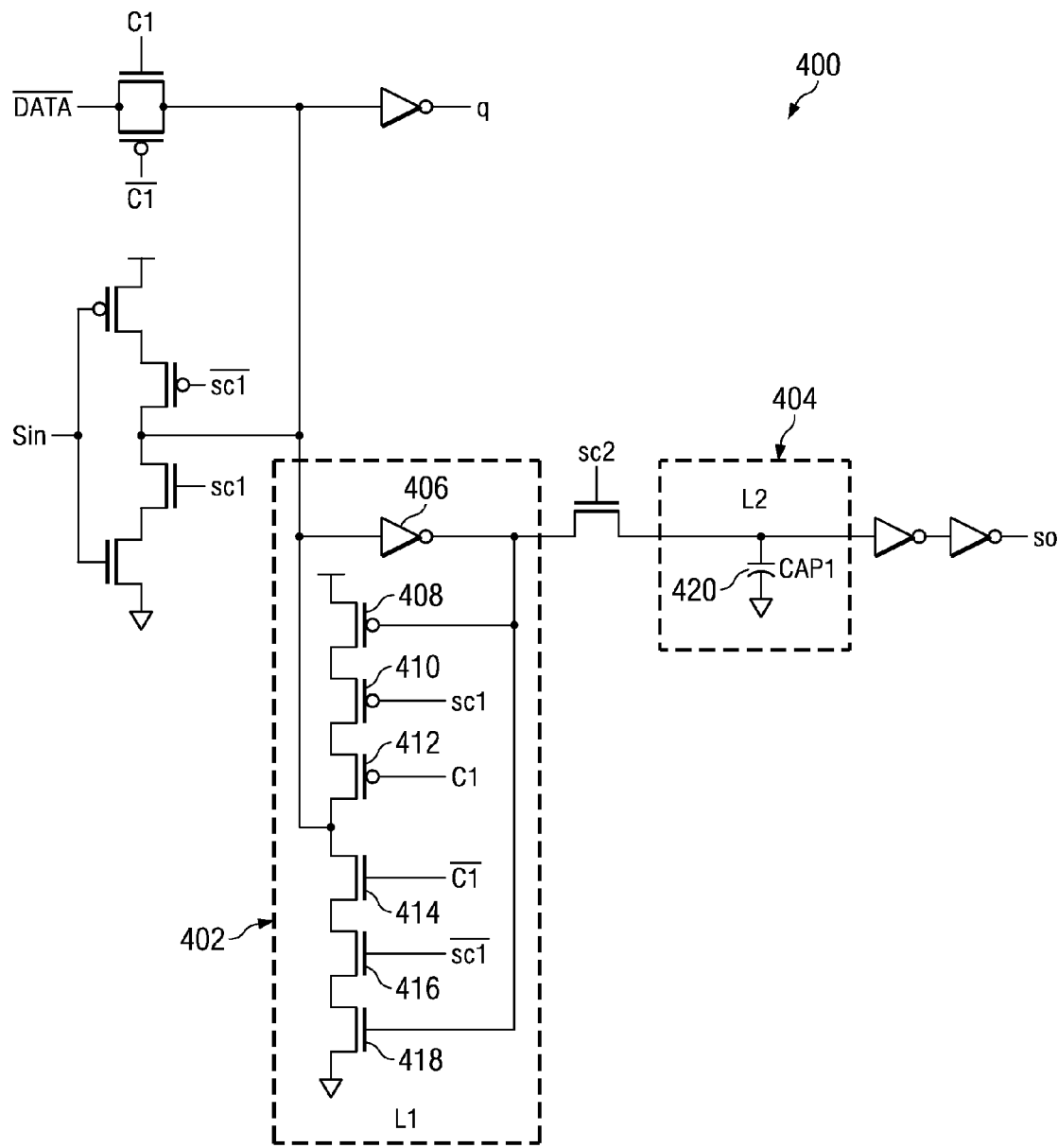
FIG. 4 is a circuit diagram of an alternative hybrid shift register latch in accordance with the illustrative embodiments.

FIGS. 3 and 4 are circuit diagrams of alternative hybrid shift register latches in accordance with the illustrative embodiments. The proposed solution in the illustrative embodiments may also be used in other situations in which a master-slave (L1-L2) latch is required for test considerations, but only one of the two latches, either the L1 or the L2 latch, is used in normal system operation, as shown in FIGS. 3 and 4. The L1 or the L2 latch to be used only in normal system operation may be determined by the previous latch stage. For example, if the previous latch stage is an L2 stage, an L1 latch must be used for the normal system operation, and vice-versa. It should be noted that the embodiments in FIGS. 3 and 4 should use appropriate clocking strategies to ensure that the DRAM portion of the latch is updated before unloading the latch using scan to read the stored value.

In particular, FIG. 3 illustrates array cell 300 which comprises L1 storage element 302 and L2 storage element 304. Each of L1 storage element 302 and L2 storage element 304 is an SRAM cell comprising an inverter, such as inverter 306 in L1 storage element 302, and inverter 308 in L2 storage element 304. Each SRAM cell also may typically comprise between four and six transistors, such as transistors 310-320 for L1 storage element 302, and transistors 322-328 for L2 storage element 304.

In this illustrative embodiment, both L1 storage element 302 and L2 storage element 304 may be used in testing operations when a master-slave (L1-L2) latch is required for test considerations. However, only one of L1 storage element 302 or L2 storage element 304 is used during normal system operation. The particular latch used in normal system operation is determined by the previous latch stage.

In addition, FIG. 4 illustrates another example of how the proposed solution in the illustrative embodiments may be used in situations in which a master-slave latch is required for test considerations, but only one of the two latches is used in normal system operation. FIG. 4 illustrates array cell 400 which comprises L1 storage element 402 and L2 storage element 404. L1 storage element 402 is an SRAM cell comprising an inverter, such as inverter 406 and between four and six transistors, such as transistors 408-418. L2 storage element 404 is a DRAM cell comprising an capacitor, such as capacitor 420.

In this illustrative embodiment, both L1 storage element 402 and L2 storage element 404 may be used in testing operations when a master-slave (L1-L2) latch is required for test considerations. However, only one of L1 storage element 402 or L2 storage element 404 is used during normal system operation. The particular latch used in normal system operation is determined by the previous latch stage.

The circuit as described above is part of the design for an integrated circuit chip. The chip design is created in a graphical computer programming language, and stored in a computer storage medium (such as a disk, tape, physical hard drive, or virtual hard drive such as in a storage access network). If the designer does not fabricate chips or the photolithographic masks used to fabricate chips, the designer transmits the resulting design by physical means (e.g., by providing a copy of the storage medium storing the design) or electronically (e.g., through the Internet) to such entities, directly or indirectly. The stored design is then converted into the appropriate format (e.g., GDSII) for the fabrication of photolithographic masks, which typically include multiple copies of the chip design in question that are to be formed on a wafer. The photolithographic masks are utilized to define areas of the wafer (and/or the layers thereon) to be etched or otherwise processed.

The description of the illustrative embodiments have been presented for purposes of illustration and description, and is not intended to be exhaustive or limited to the illustrative embodiments in the form disclosed. Many modifications and variations will be apparent to those of ordinary skill in the art. The embodiment was chosen and described in order to best explain the principles of the illustrative embodiments, the practical application, and to enable others of ordinary skill in the art to understand the illustrative embodiments for various embodiments with various modifications as are suited to the particular use contemplated.

What is claimed is:

1. A shift register latch arrangement for an array cell comprising:
   an L1 storage element in the array cell, wherein the L1 storage element comprises a static random access memory cell, and wherein the L1 storage element is used during system and testing operation of the array cell; and an L2 storage element in the array cell, wherein the L2 storage element comprises a dynamic random access memory cell, wherein the L2 storage element is used only during testing operation of the array cell.

2. The shift register latch arrangement of claim 1, wherein the static random access memory cell comprises two inverters and at least four transistors.

3. The shift register latch arrangement of claim 1, wherein the dynamic random access memory cell comprises a capacitor and one transistor.

4. The shift register latch arrangement of claim 1, wherein the dynamic random access memory cell consumes less space in the array cell than the static random access memory cell.

5. The shift register latch arrangement of claim 1, wherein the dynamic random access memory cell experiences less power leakage than the static random access memory cell.

6. The shift register latch arrangement of claim 1, wherein the power leakage experienced by the dynamic random access memory cell decreases as a charge on the capacitor decreases to zero.

7. The shift register latch arrangement of claim 1, wherein the dynamic random access memory cell is clocked when the testing operation begins to refresh the dynamic random access memory cell.

* * * * *